(12) United States Patent
Uhlich et al.

(10) Patent No.: US 12,014,710 B2
(45) Date of Patent: Jun. 18, 2024

(54) DEVICE, METHOD AND COMPUTER PROGRAM FOR BLIND SOURCE SEPARATION AND REMIXING

(71) Applicant: Sony Group Corporation, Tokyo (JP)

(72) Inventors: Stefan Uhlich, Stuttgart (DE); Michael Enenkl, Stuttgart (DE)

(73) Assignee: SONY GROUP CORPORATION, Tokyo (JP)

( * ) Notice: Subject to any disclaimer, the term of this patent is extended or adjusted under 35 U.S.C. 154(b) by 279 days.

(21) Appl. No.: 17/421,016

(22) PCT Filed: Jan. 14, 2020

(86) PCT No.: PCT/EP2020/050741
§ 371 (c)(1),
(2) Date: Jul. 7, 2021

(87) PCT Pub. No.: WO2020/148246
PCT Pub. Date: Jul. 23, 2020

(65) Prior Publication Data
US 2022/0101821 A1     Mar. 31, 2022

(30) Foreign Application Priority Data
Jan. 14, 2019   (EP) ..................................... 19151653

(51) Int. Cl.
*G10H 1/36*      (2006.01)
*G10L 21/0224*   (2013.01)
*G10L 21/0272*   (2013.01)

(52) U.S. Cl.
CPC ......... *G10H 1/366* (2013.01); *G10L 21/0224* (2013.01); *G10L 21/0272* (2013.01); *G10H 2210/056* (2013.01); *G10H 2250/305* (2013.01)

(58) Field of Classification Search
CPC ............ G10H 1/366; G10H 2210/056; G10H 2250/305; G10L 21/0224; G10L 21/0272
See application file for complete search history.

(56) References Cited

U.S. PATENT DOCUMENTS 9,741,360 B1 *  8/2017  Li ........................... G10L 25/51
2006/0053002 A1  3/2006  Visser et al.
2006/0200344 A1  9/2006  Kosek et al.
(Continued)

FOREIGN PATENT DOCUMENTS

CN   106537502 A   3/2017
CN   108766455 A   11/2018

OTHER PUBLICATIONS

International Search Report and Written Opinion dated Feb. 7, 2020, received for PCT Application PCT/EP2020/050741, Filed on Jan. 14, 2020, 11 pages.
(Continued)

*Primary Examiner* — Andrew L Sniezek
(74) *Attorney, Agent, or Firm* — XSENSUS LLP

(57) ABSTRACT

An electronic device comprising a circuitry configured to perform (402; 602; 902; 1002) blind source separation (201) based on a received input signal (1) to obtain separated sources; to perform (403; 605; 906; 1005) time-domain filtering (202) on at least one of the separated sources to obtain at least one filtered separated source; and to perform (404; 606; 907; 1006) remixing or upmixing (203) based on the at least one filtered separated source.

19 Claims, 12 Drawing Sheets

(56) References Cited

U.S. PATENT DOCUMENTS

| | | |
|---|---|---|
| 2009/0190774 A1 | 7/2009 | Wang et al. |
| 2010/0111329 A1* | 5/2010 | Namba ................ H04R 29/006 |
| | | 381/119 |
| 2017/0236531 A1* | 8/2017 | Koretzky .................. H04S 5/00 |
| | | 381/17 |
| 2017/0374201 A1 | 12/2017 | Nesta et al. |
| 2018/0176706 A1 | 6/2018 | Cardinaux et al. |
| 2019/0139563 A1* | 5/2019 | Chen ...................... G06N 3/044 |

OTHER PUBLICATIONS

Jot et al., "Spatial Enhancement of Audio Recordings", AES 23rd International Conference, XP-002401944, May 23-25, 2003, pp. 1-11.

Rafii et al., "MUSDB18—A Corpus for Music Separation", Available Online At: https://zenodo.org/record/1117372#.YMC0IfkzaUk, Dec. 17, 2017, pp. 1-6.

Ma et al., "Reducing Musical Noise in Blind Source Separation by Time-Domain Sparse Filters and Split Bregman Method", Conference: Interspeech 2010, Sep. 26-30, 2010, 4 pages.

Vincent et al., "Performance Measurement in Blind Audio Source Separation" IEEE Transactions on Audio, Speech and Language Processing, Institute of Electrical and Electronics Engineers, vol. 14, No. 4, 2006, pp. 1462-1469.

\* cited by examiner

|  | $\tau$ | $s$ | $w$ |
|---|---|---|---|
| Vocals | 0.3 | 0.3 | 2 |
| Drums | 0.4 | 0.3 | 3 |
| Bass | 0.2 | -0.3 | 4 |
| Other | 0.1 | -0.3 | 5 |

Fig. 8

DEVICE, METHOD AND COMPUTER PROGRAM FOR BLIND SOURCE SEPARATION AND REMIXING

CROSS-REFERENCE TO RELATED APPLICATIONS

The present application is based on PCT filing PCT/EP2020/050741, filed Jan. 14, 2020, which claims priority to EP 19151653.3, filed Jan. 14, 2019, the entire contents of each are incorporated herein by reference.

TECHNICAL FIELD

The present disclosure generally pertains to the field of audio processing, in particular to a device, method and computer program for blind source separation and renixing or upmixing.

TECHNICAL BACKGROUND

There is a lot of audio content available, for example, in the form of compact disks (CD), tapes, audio data files which can be downloaded from the internet, but also in the form of sound tracks of videos, e.g. stored on a digital video disk or the like, etc. Typically, audio content is already mixed, e.g. for a mono or stereo setting without keeping original audio source signals from the original audio sources which have been used for production of the audio content. However, there exist situations or applications where a remixing or upmixing of the audio content is envisaged. For instance, in situations where the audio content shall be played on a device having more audio channels available than the audio content provides, e.g. mono audio content to be played on a stereo device, stereo audio content to be played on a surround sound device having six audio channels, etc.

Although there generally exist techniques for remixing audio content, it is generally desirable to improve device and method for remixing or upmixing of audio content.

SUMMARY

According to a first aspect the disclosure provides an electronic device comprising a circuitry configure to: perform blind source separation based on a received input signal to obtain separated sources; perform time-domain filtering on at least one of the separated sources to obtain at least one filtered separated source; and perform remixing or upmixing based on the at least one filtered separated source and based on the separated sources to obtain a remixed or upmixed signal.

According to a further aspect the disclosure provides a method comprising: performing blind source separation based on a received input signal to obtain separated sources; performing time-domain filtering on at least one of the separated sources to obtain at least one filtered separated source; and performing remixing or upmixing based on the at least one filtered separated source and based on the separated sources to obtain a remixed or upmixed signal.

According to a further aspect the disclosure provides a computer program comprising instructions, the instructions when executed on a processor causing the processor to: perform blind source separation based on a received input signal to obtain separated sources; perform time-domain filtering on at least one of the separated sources to obtain at least one filtered separated source, and perform remixing or upmixing based on the at least one filtered separated source and based on the separated sources to obtain a remixed or upmixed signal.

Further aspects are set forth in the dependent claims, the following description and the drawings.

BRIEF DESCRIPTION OF THE DRAWINGS

Embodiments are explained by way of example with respect to the accompanying drawings, in which:

FIG. 8 shows a table visualizing the dependence of the separated sources, comprising "vocals", "drums", "bass" and "other" with the parameters τ, s, w.

DETAILED DESCRIPTION OF EMBODIMENTS

Figure 1:
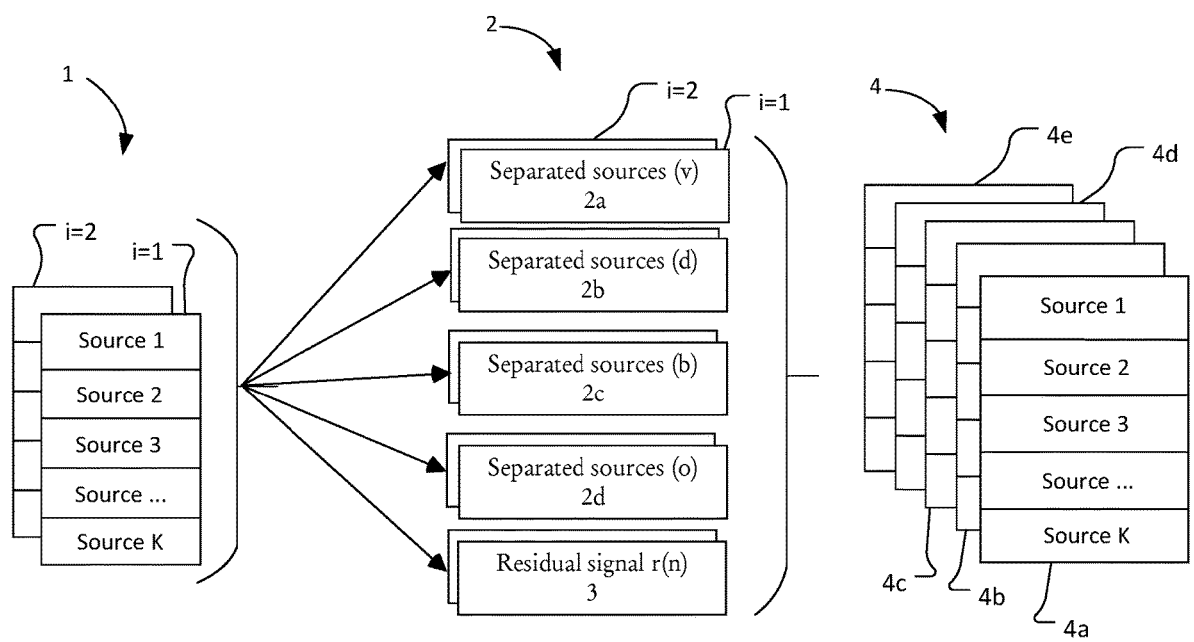
FIG. 1 schematically shows a general approach of audio upmixing/remixing by means of audio source separation (BSS)

Before a detailed description of the embodiments is given under reference of FIGS. 1 to 11, some general explanations are made.

The embodiments disclose an electronic device comprising a circuitry configure to perform blind source separation based on a received input signal to obtain separated sources; perform time-domain filtering (202) on at least one of the separated sources to obtain at least one filtered separated source; and perform remixing or upmixing based on the at least one filtered separated source.

The circuitry of the electronic device may include a processor, may for example be CPU, a memory (RAM, ROM or the like), a memory and/or storage, interfaces, etc. Circuitry may comprise or may be connected with input means (mouse, keyboard, camera, etc.), output means (display (e.g. liquid crystal, (organic) light emitting diode, etc.)), loudspeakers, etc., a (wireless) interface, etc., as it is generally known for electronic devices (computers, smartphones, etc.). Moreover, circuitry may comprise or may be connected with sensors for sensing still images or video image data (image sensor, camera sensor, video sensor, etc.), for sensing environmental parameters (e.g. radar, humidity, light, temperature), etc.

In audio source separation, an input signal comprising a number of sources (e.g. instruments, voices, or the like) is decomposed into separations. Audio source separation may be unsupervised (called "blind source separation", BSS) or partly supervised. "Blind" means that the blind source separation does not necessarily have information about the original sources. For example, it may not necessarily know how many sources the original signal contained or which sound information of the input signal belong to which original source. The aim of blind source separation is to decompose the original signal separations without knowing the separations before. A blind source separation unit may use any of the blind source separation techniques known to the skilled person. In (blind) source separation, source signals may be searched that are minimally correlated or maximally independent in a probabilistic or information-theoretic sense or on the basis of a non-negative matrix factorization structural constraints on the audio source signals can be found. Methods for performing (blind) source separation are known to the skilled person and are based on, for example, principal components analysis, singular value decomposition, (in)dependent component analysis, non-negative matrix factorization, artificial neural networks, etc.

Although, some embodiments use blind source separation for generating the separated audio source signals, the present disclosure is not limited to embodiments where no further information is used for the separation of the audio source signals, but in some embodiments, further information is used for generation of separated audio source signals. Such further information can be, for example, information about the mixing process, information about the type of audio sources included in the input audio content, information about a spatial position of audio sources included in the input audio content, etc.

The input signal can be an audio signal of any type. It can be in the form of analog signals, digital signals, it can origin from a compact disk, digital video disk, or the like, it can be a data file, such as a wave file, mp3-file or the like, and the present disclosure is not limited to a specific format of the input audio content. An input audio content may for example be a stereo audio signal having a first channel input audio signal and a second channel input audio signal, without that the present disclosure is limited to input audio contents with two audio channels. In other embodiments, the input audio content may include any number of channels, such as remixing of an 5.1 audio signal or the like.

The input signal may comprise one or more source signals. In particular, the input signal may comprise several audio sources. An audio source can be any entity, which produces sound waves, for example, music instruments, voice, vocals, artificial generated sound, e.g. origin form a synthesizer, etc.

The input audio content may represent or include mixed audio sources, which means that the sound information is not separately available for all audio sources of the input audio content, but that the sound information for different audio sources, e.g. at least partially overlaps or is mixed.

The circuitry may be configured to perform the remixing or upmixing based on the at least one filtered separated source and based on other separated sources obtained by the blind source separation to obtain the remixed or upmixed signal. The remixing or upmixing may be configured to perform remixing or upmixing of the separated sources, here "vocals", "bass", "drums" and "other" to produce a remixed or upmixed signal, which may be send to the loudspeaker system. The remixing or upmixing may further be configured to perform remixing or upmixing of one or more of the separated sources to produce a remixed or upmixed signal, which may be send to one or more of the output channels of the loudspeaker system.

The separations produced by blind source separation from the input signal may for example comprise a "vocals" separation, a "bass" separation, a "drums" separations and an "other" separation. In the "vocals" separation all sounds belonging to human voices might be included, in the "bass" separation all noises below a predefined threshold frequency might be included, in the "drums" separation all noises belonging to the "drums" in a song/piece of music might be included and in the "other" separation all remaining sounds might be included.

Source separation obtained by a Music Source Separation (MSS) system may result in artefacts such as interference, crosstalk or noise. The time-domain filtering may be performed to the separated sources produced by blind source separation in order to decrease the effect of such artefacts, crosstalk or noise.

Performing time-domain filtering may improve the Signal to Distortion Ration (SDR) for a separated source. That is, performing time-domain filtering may reduce the artefacts and/or interference occurring in the silent parts of the instruments. Consequently, the objective performance of the separated sources as well as the subjective quality may be improved. The performance and the quality of the separated sources may be considerably improved especially if the separated sources are listened to individually. As it is known to the skilled person, MSS systems never output really zero values especially when it comes to frequency domain approaches. Hence, time-domain filtering may include looking at the output of a MSS system and checking whether long time periods of "real zero" occur.

Still further, the separations may also comprise a residual that comprises "other" sound not clearly identifiable as specific instrument or source.

The circuitry may be configured to perform the time-domain filtering by processing a window around a current sample and setting the current sample to zero if there is no sample in the window which has an amplitude that is larger or equal to a threshold value. Performing time-domain filtering may thus comprise setting to zero all the samples of signals being around a window and do not exceed a predefined threshold.

The threshold value used in time-domain filtering may be based on a predefined threshold factor and on a maximal signal determined from the separated source.

The circuitry may be configured to perform the time-domain filtering based on a window size.

Still further, the circuitry may be configured to perform the time-domain filtering based on a windows shift. Performing time-domain filtering may for example comprise shifting the window to the left in order to look at past samples or may comprise shifting the window to the right in order to look more at future samples.

The present disclosure is not limited to a specific number of audio channels all kinds of remixing, upmixing and downmixing can be realized.

In some of the embodiments, the circuitry may be configured to perform an adaptive time-domain filtering.

For example, the circuitry may be configured to perform an adaptive time-domain filtering based on a reverberation time. The circuitry may for example be configured to determine a windows size and/or a windows shift based on the retrieved reverberation time. The reverberation time may for example be a $T_{60}$ time which is a measure of the time required for the sound to "fade away" in an enclosed area after the source of the sound has stopped.

In addition or alternatively, the circuitry may be configured to perform an adaptive time-domain filtering of a first separated source based on a detected signal in a second separated source. This addresses the fact that the quality of the upmixing/remixing may depend on the quality of the source separation. One common problem for a source separation into instruments such as "bass", "drums", "other" and "vocals", is that "drums" and "vocals" are not clearly separated. For example, parts of a "drums" signal could be wrongly separated into the "vocals". If the remixing/upmixing to system is not aware that the separation failed, then the listener will perceive annoying artefacts. For example, the drums could be perceived to be moving between front and back if "vocals" is placed in front of the listener and "other" is placed in the back of the listener. That "drums" and "vocals" are not clearly separated is a common problem for a source separation. If the remixing/upmixing system is not aware that the separation failed, then the listener will perceive annoying artefacts. Perform an adaptive time-domain filtering of a first separated source based on a detected signal in a second separated source may addresses this problem. In particular, the circuitry may in particular be configured to set a threshold factor based on the detected "drums" signal in the "drums" separated source. For example, the signal may be perceived by detecting a "drums" signal in the "drums" separated sources and performing a time-domain filtering on a "vocals" separation based on the detected "drums" signal.

In some embodiments, performing time-domain filtering may comprise performing time-domain filtering to the separated sources "vocals" and "drums" based on the parameter s.

In some embodiments, the circuitry may be further configured to calculate a short-time energy based on the received input signal and configured to determine a parameter $\tau'$ based on the calculated short-time energy.

The circuitry may be further configured to output the remixed or upmixed signal to a loudspeaker system.

In some embodiments, the circuitry may be further configured to perform bandlimited filtering.

Bandlimited filtering may be performed by using a filterbank, or the like, to obtain a bandlimited signal. For example, bandlimited filtering may be performed to each of the separated sources and a bandlimited signal may be obtained. Time-domain filtering may be performed to each of the bandlimited separated source signals independently.

In some embodiments, performing bandlimited filtering may comprise performing bandlimited filtering to the separated sources "vocals" and "drums" to obtain bandlimited "vocals" and bandlimited "drums".

In some embodiments, performing time-domain filtering may comprise performing time-domain filtering to the bandlimited "vocals" and bandlimited "drums" to obtain filtered "vocals" and filtered "drums".

Performing remixing or upmixing of one or more separated sources of the separated sources may include remixing or upmixing of one selected source of the separated sources or of a selected subgroup of the separated sources. For example, performing remixing or upmixing of one or more separated sources of the separated sources may include isolating a selected separation from the separated sources. Alternatively, performing remixing or upmixing may include removing a specific separated source from the separated sources. For example, performing remixing or upmixing of one or more separated sources of the separated sources may include isolating or removing the vocals separation. This may be helpful in order to listen or silent a single source separation, e.g. in a Karaoke setting.

The embodiments also disclose a method comprising performing blind source separation based on a received input signal to obtain separated sources; performing time-domain filtering to at least one of the separated sources to obtain at least one filtered separated source; and performing remixing or upmixing based on the at least one filtered separated source.

According to a further aspect, the disclosure provides a computer program comprising instructions, the instructions when executed on a processor causing the processor to perform blind source separation based on a received input signal to obtain separated sources; perform time-domain filtering to at least one of the separated sources to obtain at least one filtered separated source; and perform remixing or upmixing based on the at least one filtered separated source.

The term "signal" as used herein is not limited to any specific format and it can be an analog signal, a digital signal or a signal which is stored in a data file, data stream, or any other format.

Embodiments are now described by reference to the drawings.

Audio Upmixing/Remixing by Means of Blind Source Separation (BSS)

FIG. 1 schematically shows a general approach of audio upmixing/remixing by means of blind source separation (BSS).

First, source separation (also called "demixing") is performed which decomposes a source audio signal 1 comprising multiple channels I and audio from multiple audio sources Source 1, Source 2, . . . Source K (e.g. instruments, voice, etc.) into "separations", here into source estimates 2a-2d for each channel i, wherein K is an integer number and denotes the number of audio sources. In the embodiment here, the source audio signal 1 is a stereo signal having two channels i=1 and i=2. As the separation of the audio source signal may be imperfect, for example, due to the mixing of the audio sources, a residual signal 3 (r(n)) is generated in addition to the separated audio source signals 2a-2d. The residual signal may for example represent a difference between the input audio content and the sum of all separated audio source signals. The audio signal emitted by each audio source is represented in the input audio content 1 by its respective recorded sound waves. For input audio content having more than one audio channel, such as stereo or surround sound input audio content, also a spatial information for the audio sources is typically included or represented by the input audio content, e.g. by the proportion of the audio source signal included in the different audio channels. The separation of the input audio content 1 into separated audio source signals 2a-2d and a residual 3 is performed on the basis of blind source separation or other techniques which are able to separate audio sources.

In a second step, the separations 2a-2d and the possible residual 3 are remixed and rendered to a new loudspeaker signal 4, here a signal comprising five channels 4a-4e, namely a 5.0 channel system. On the basis of the separated audio source signals and the residual signal, an output audio content is generated by mixing the separated audio source signals and the residual signal on the basis of spatial information. The output audio content is exemplary illustrated and denoted with reference number 4 in FIG. 1.

In the following, the number of audio channels of the input audio content is referred to as $M_{in}$ and the number of audio channels of the output audio content is referred to as $M_{out}$. As the input audio content 1 in the example of FIG. 1 has two channels i=1 and i=2 and the output audio content 4 in the example of FIG. 1 has five channels 4a-4e, $M_{in}$=2 and $M_{out}$=5. The approach in FIG. 1 is generally referred to as remixing, and in particular as upmixing if $M_{in}$<$M_{out}$. In the example of the FIG. 1 the number of audio channels $M_{in}$=2 of the input audio content 1 is smaller than the number of audio channels $M_{out}$=5 of the output audio content 4, which is, thus, an upmixing from the stereo input audio content 1 to 5.0 surround sound output audio content 4.

Remixing/Upmixing Based on Time-Domain Filtering

Figure 2:
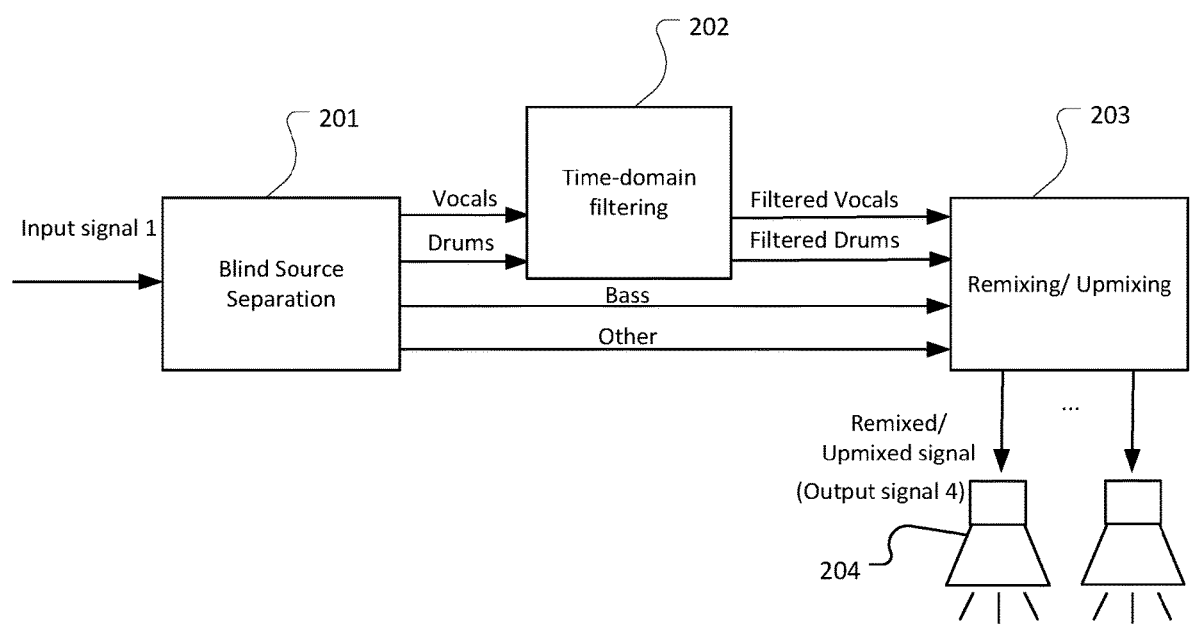
FIG. 2 schematically shows a process of remixing/upmixing based on time-domain filtering approach.

FIG. 2 schematically shows a process of remixing/upmixing based on time-domain filtering approach. The process comprises a blind source separation 201, a time-domain filtering 202 and an remixing/upmixing 203. An input signal (see input signal 1 in FIG. 1) containing multiple sources (see Source 1, 2, . . . K in FIG. 1), with multiple channels (e.g. $M_{in}$=2), is input to the blind source separation 201 and decomposed into separations (see separated sources 2a-2d in FIG. 1) as it is described with regard to FIG. 1 above, here into "vocals", "drums", "bass" and "other". The separated sources (see separated signal 2 in FIG. 1), here "vocals", "drums", "bass" and "other", are transmitted to time-domain filtering 202 and to remixing/upmixing 203. In particular, the "vocals" separated source and the "drums" separated source are transmitted to the time-domain filtering 202 and the "bass" separated source and the "other" separated source are transmitted to the remixing/upmixing 203.

Figure 4:
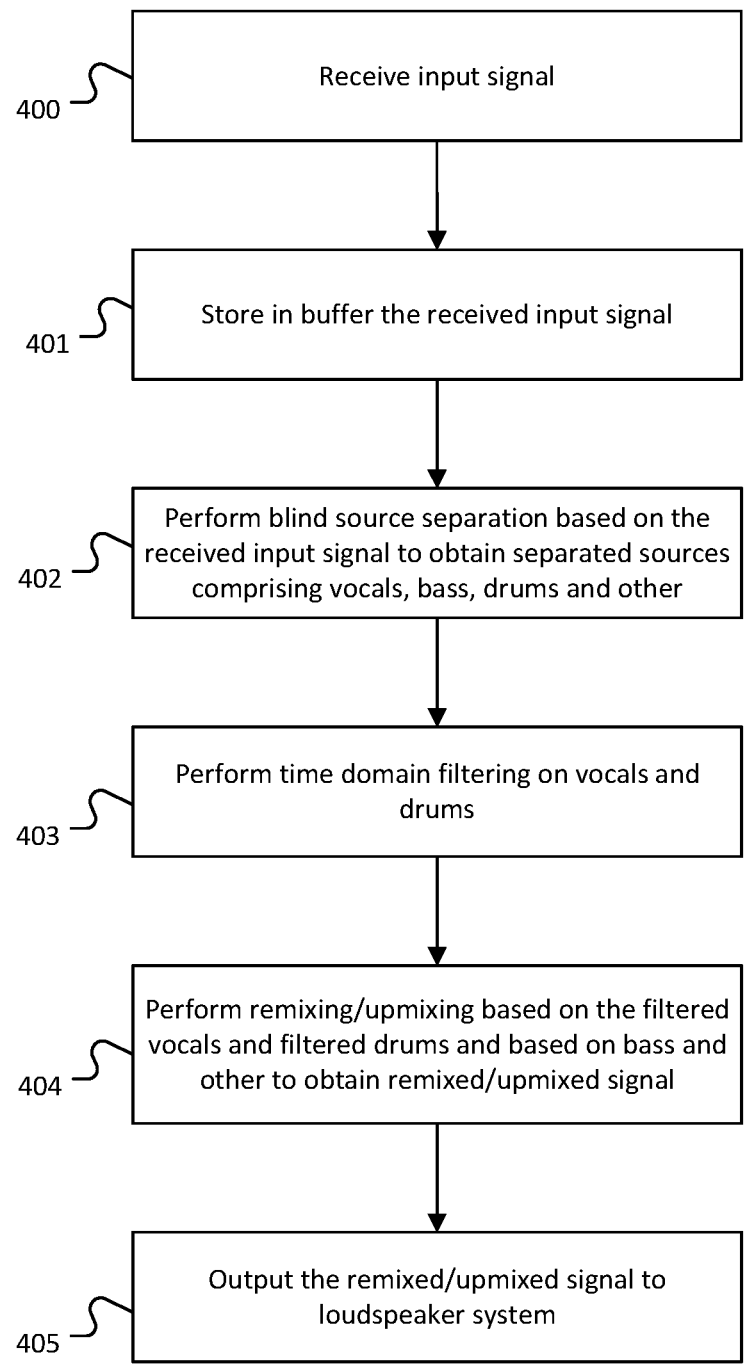
FIG. 4 shows a flow diagram visualizing a method of a time-domain filtering approach.
Figure 5:
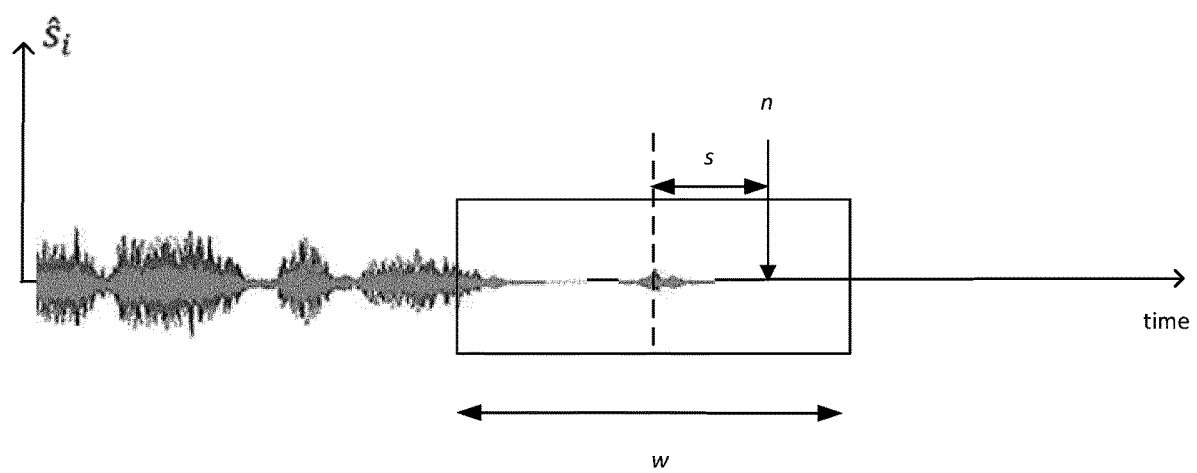
FIG. 5 schematically shows an illustration of a time-domain filtering approach.

The time-domain filtering 202 is configured to perform time-domain filtering to the "vocals" and the "drums" to produce filtered "vocals" and filtered "drums" (see 403 in FIG. 4 and FIG. 5 and corresponding description). The time-domain filtering 202 is improving, for example, the Signal to Distortion Ration (SDR) for "vocals" and "drums". The produced filtered "vocals" and filtered "drums" are transmitted to the remixing/upmixing 203. In addition, also the "bass" and the "other" are transmitted to the remixing/upmixing 203. The remixing/upmixing 203 remixes/upmixes the filtered "vocals", the filtered "drums", the "bass" and the "other". Furthermore, the remixing/upmixing 203 sends the remixed/upmixed signal to a loudspeaker system 204.

Figure 3:
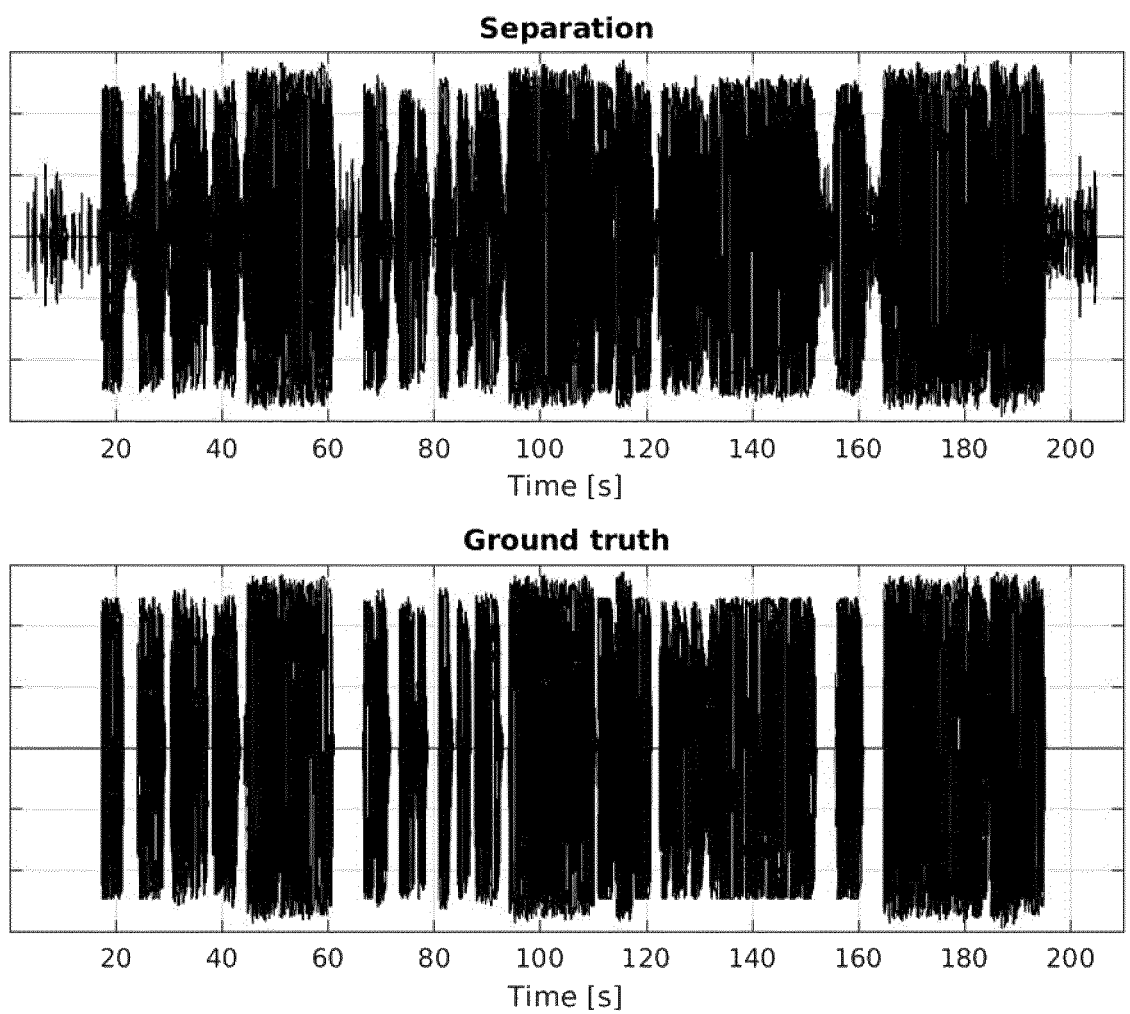
FIG. 3 schematically shows an example of a waveform of a "vocal" separation and a waveform of a "vocal" ground truth, both in logarithmic scale.

FIG. 3 schematically shows an example of a waveform of a vocals separation and a waveform of a vocals "ground truth", both in logarithmic scale. The upper waveform is a waveform of a vocal separation output of a Music Source Separation (MSS) system and the lower waveform is a ground truth waveform related to the vocal separation. In both waveforms (upper and lower), the x-axis represents the time in seconds, which extends from 0s to 210s, and the y-axis represents the respective amplitude of the signal (here in dB). The vocals "ground truth" waveform is the waveform of the vocals recorded independently from all the instruments. The vocals "ground truth" waveform is the waveform of the vocals before they are mixed with the instruments to obtain one audio signal and then perform blind source separation on this audio signal (see input signal 1 in FIG. 1 and FIG. 2). The waveform of the vocals separation is the waveform obtained after performing blind source separation on the audio signal (see input signal 1 in FIG. 1 and FIG. 2). As it can be taken from these two waveforms, the separation obtained by the MSS system (see upper waveform) is noisy. In particular, where the vocals ground truth represents silence, the vocals separation comprises noise. This noise represents artefacts and/or interferences produced by the MSS, e.g. crosstalk from the "drums" to the "vocals".

FIG. 4 shows a flow diagram visualizing a method of blind source separation based on time-domain filtering. This method may for example be implemented by software that is executed by a processor (1201 in FIG. 11). At 400, an input signal is received. At 401, the received input signal is stored in a buffer. At 402, blind source separation (see e.g. FIG. 1 and 201 in FIG. 2) is performed based on the received input signal to obtain separated sources comprising "vocals", "bass", "drums" and "other". At 403, a time-domain filtering is performed on the "vocals" and "drums", to obtain filtered "vocals" and filtered "drums". At 404, remixing/upmixing is performed based on the filtered "vocals" and filtered "drums" obtained at 403, and based on the "bass" and "other" obtained at 402, to obtain a remixed/upmixed signal (see FIG. 2). At 405, the remixed/upmixed signal is output to a loudspeaker system (204 in FIG. 2).

In the following, the time-domain filtering 403 performed on the "vocals" and "drums", to obtain filtered "vocals" and filtered "drums" is described in more detail. The idea of the time-domain filtering 403 is to exploit the fact that many small amplitude samples in the separations (here "vocals" and "drums") are noise and can therefore be safely set to zero. As the time-domain filtering 403 works in the time domain, it becomes possible to exploit this knowledge.

Let $\hat{s}_i(n)$ denote the waveform of the separated source (here e.g. the "vocals" or the "drums"), where i=1, . . . , I being the channel index. For example, I=2 corresponds to the stereo case as described in more detail with regard to FIG. 1.

In time-domain filtering a window around a current sample $\hat{s}_i(n)$ at time instance a is considered and $\hat{s}_i(n)$ is set to zero for i=1, . . . , I if there is no sample in the window which has an amplitude that is larger or equal to $\tau \cdot \max_{m,i}|\hat{s}_i(m)|$, where $\tau$ denotes a threshold factor, that is, if $$\max_{m \in [-\frac{w}{2}, \frac{w}{2}], i=1, \ldots, I}|\hat{s}_i(n+m+s)| \leq \tau \cdot \max_{m,i}|\hat{s}_i(m)| \quad \text{(Eq. 1)}$$

where a denotes a window length, s denotes a window shift and m denotes the samples in the window w.

If (Eq. 1) is true then $\hat{s}_i(n)$ is set to zero.

The window shift s shifts the window a by the shift s. In the time-domain filtering approach, the reverberation tails should not be cut-off. The reverberation tail is a persistence of sound after the sound is produced, that is, the reflections of the sound continue, decreasing in amplitude, until a zero amplitude is reached. Reverberation tails are of great importance, especially for "vocals". That is, the window may be shifted to the left, allowing looking more to the samples of the past than to the sample of the future. If s<0 the window is shifted to the left and if s>0 the window is shifted to the right. If the window is shifted to the left, more samples of the past are included in the window (it is "looked more into the past samples"). Similarly, if the window is shifted to the right, more samples of the future are included in the window (it is "looked more into the future samples").

That is, the time-domain filtering 403 acts like a "gate" which allows a signal to pass only when the signal inside the window exceeds the threshold $\tau \cdot \max_{m,i}|\hat{s}_i(m)|$.

FIG. 5 schematically shows an illustration of this time-domain filtering approach. The waveform $\hat{s}_i$ of a separated source (here e.g. the "vocals" or the "drums") is shown, where i=1, . . . , I indicates the channel index, n indicates the time instance (respectively sample number) of the current sample $\hat{s}_i(n)$, w denotes the window length, s denotes the window shift.

The parameters w, s and τ can be chosen by the skilled person according to the specific use case. Exemplary values for these parameters w, s and τ may be found, for example, using a validation set and finding the values that maximize the Signal to Distortion Ration (SDR) as defined in "E. Vincent, R Gribonval and C. Févotte, Performance measurement in blind audio source separation, IRR Trans. Audio, Speech and Language Processing, 14(4), pp 1462 1489, 2006".

Figure 6:
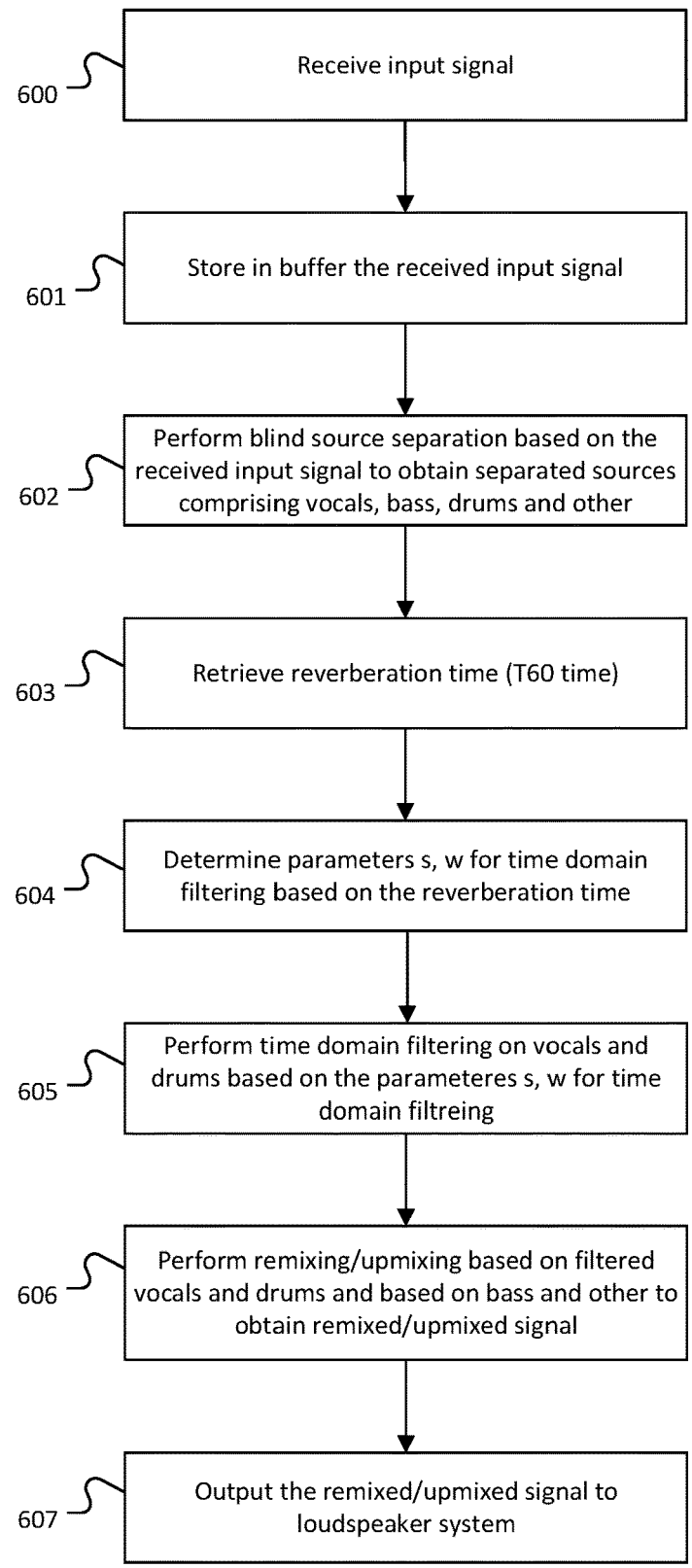
FIG. 6 shows a flow diagram visualizing a method of time-domain filtering based on the parameters s,w related to reverberation time ($T_{60}$ time)

FIG. 6 shows a flow diagram visualizing a method of adaptive time-domain filtering where the parameters s,w are adapted to a reverberation time ($T_{60}$ time). This method may for example be implemented by software that is executed by a processor (1201 in FIG. 11). At 600, an input signal is received. At 601, the received input signal stored in a buffer. At 602, blind source separation is performed based on the received input signal to obtain separated sources comprising "vocals", "bass", "drums" and "other". At 603, reverberation time ($T_{60}$ time) retrieved and the process continues at 604. At 604, parameters s,w for the time-domain filtering is determined, based on the retrieved reverberation time. At 605, time-domain filtering is performed on the "vocals" and "drums", based on the parameters s,w for the time-domain filtering determined at 604, to obtain filtered "vocals" and filtered "drums". At 606, remixing/upmixing is performed based on the filtered "vocals" and filtered "drums" obtained at 605, and based on the "bass" and "other" obtained at 602, to obtain remixed/upmixed signal (see FIG. 2). At 607, the remixed/upmixed signal is output to a loudspeaker system 204 (see FIG. 2).

In the following, it is described in more detail how the reverberation time is retrieved at 603. The reverberation time is a measure of the time required for the sound to "fade away" in an enclosed area after the source of the sound has stopped. The reverberation time may for example be defined as the time for the sound to die away to a level 60 dB below its original level ($T_{60}$ time). This reverberation time $T_{60}$ is given by the Sabine equation $$T_{60} = \frac{24\ln 10^1}{c_{20}} \frac{V}{Sa} \approx 01611 \ sm^{-1} \frac{V}{Sa}$$

where $C_{20}$ is the speed of sound in the room (for 20 degrees Celsius), V is the volume of the room in m³, S is the total surface area of room in m², a is the average absorption coefficient of room surfaces, and the product Sa is the total absorption. That is, in the case that the parameters V,S, a of the room are known (e.g. in a recording situation), the $T_{60}$ time can be determined as defined above.

Alternatively, the reverberation time may be determined by analyzing the waveform as defined e.g. by Rama Ratnam et al in "Blind estimation of reverberation time", J. Acoust. Soc. Am. 114 (5), November 2003.

Yet alternatively, the reverberation time may be obtained from knowledge about the audio processing chain that produced the input signal (for example the reverberation time may be a predefined parameter set in a reverberation processor, e.g. algorithmic or convolution reverb used in the processing chain).

In the following it is described in more detail how at 604 the parameters s,w are adaptively determined based on the reverberation time ($T_{60}$ time). The parameters s, w are retrieved in such a way that the reverberation tails (see FIG. 5) will not cut-off. That is, the "gate" may be "open" for at least as long after every separated source signal that exceeds the threshold $\Sigma \cdot \max_{m,i} |\hat{s}_i(m)|$ (see 403 in FIG. 4) has been transmitted and until the reverberation is below a specified threshold. The threshold is chosen in such a way that the cut-off of the reverberation tails are prevented. That is, the "gate" will be an adaptive "gate" that adapts to the reverberation time ($T_a$ time).

Figure 7:
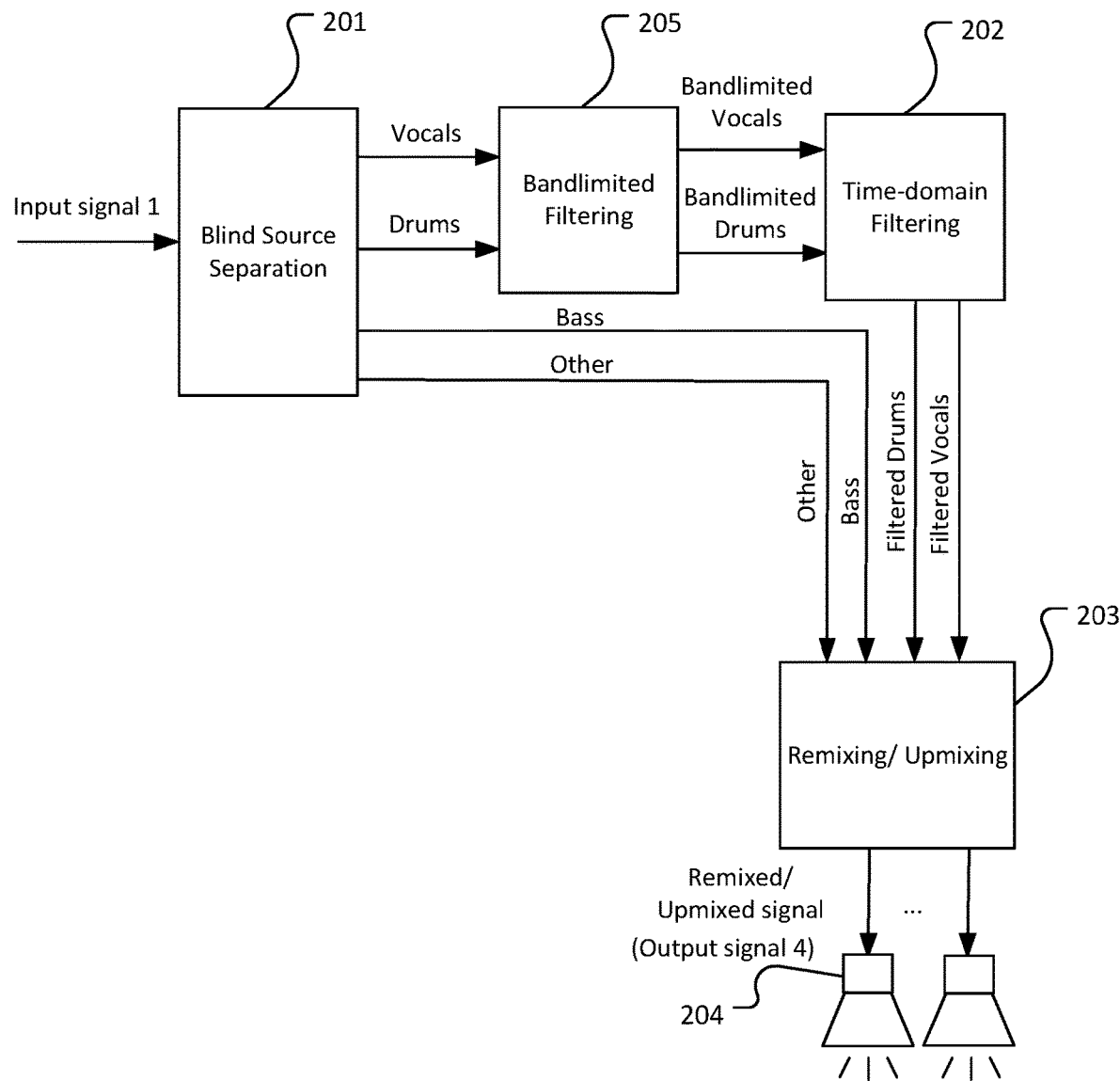
FIG. 7 schematically shows a process of remixing/upmixing based on bandlimited filtering and based on time-domain filtering approach.

FIG. 7 schematically shows a process of remixing/upmixing based on bandlimited filtering and based on time-domain filtering. The process of FIG. 7 is similar with the process of FIG. 2 with the difference that before time-domain filtering, bandlimited filtering is performed to the separated sources. The process comprises a blind source separation 201, a time-domain filtering 202, an remixing/upmixing 203 and a bandlimited filtering 205. An input signal (see input signal 1 in FIG. 1) containing multiple sources (see Source 1, 2, ... K in FIG. 1), with multiple channels (e.g. $M_{in}$=2), is input to the blind source separation 201 and decomposed into separations (see separated sources 2a-2d in FIG. 1) as it is described with regard to FIG. 1 above, here into "vocals", "drums", "bass" and "other". The separated sources (see separated signal 2 in FIG. 1), here "vocals", "drums", "bass" and "other", are transmitted to bandlimited filtering 205 and to remixing/upmixing 203. In particular, the "vocals" and the "drums" are transmitted to the bandlimited filtering 205 and the "bass" and the "other" are transmitted to the remixing/upmixing 203.

The bandlimited filtering 205 is configured to perform bandlimited filtering to the "vocals" and "drums", using a filterbank, to obtain bandlimited signals, namely bandlimited "vocals" and bandlimited "drums". The parameters of the filterbank can be chosen by the skilled person according to the specific use case. The time-domain filtering 202 is configured to perform time-domain filtering to the bandlimited "vocals" and to the bandlimited "drums" to produce filtered "vocals" and filtered "drums". The produced filtered "vocals" and filtered "drums" are transmitted to the remixing/upmixing 203. The remixing/upmixing 203 remixes/upmixes the filtered "vocals", the filtered "drums", the "bass" and the "other". Furthermore, the remixing/upmixing 203 sends the remixed/upmixed signal to the loudspeaker system 204. The idea of the time-domain filtering approach is to exploit the fact that time-domain filtering is improving the Signal to Distortion Ration (SDR) for the "vocals" and the "drums". As the time-domain filtering is performed to each of the bandlimited separated source signals independently, here the bandlimited "vocals" and for the bandlimited "drums", it is possible to improve the SDR for the bandlimited "vocals" and for the bandlimited "drums".

The parameters r, s, a may be chosen in dependence of the instrument: FIG. 8 shows an exemplary table visualizing a possible dependence of the separated sources, comprising "vocals", "drums", "bass" and "other" with the parameters τ, s, w. The parameter τ denotes the threshold factor, the parameter s denotes the window shift and the parameter w denotes the window length. The parameters τ, s, a depend on the instrument and as the input signal is separated in "vocals", "drums", "bass" and "other", the parameters τ, s, w depend on each one of the, mentioned above, separated sources. The best values for the parameters τ, s, a may be determined, for example, through a validation dataset, as mentioned in FIG. 5, above. In this embodiment, for example, for the "vocals", the parameter τ is 0.3, the parameter s is 0.3 and the parameter a is 2. For the "drums", the parameter τ is 0.4, the parameter s is 0.3 and the parameter a is 3. For the "bass", the parameter τ is 0.2, the parameter s is −0.3 and the parameter a is 4. For the "other", the parameter τ is 0.1, the parameter s is −0.3 and the parameter w is 5.

Blind source separation (BSS) is typically not perfect. For example, crosstalk may result in interference appearing in the separated sources. In particular, it has been recognized that crosstalk happens from the drums to the vocals.

Figure 9A:
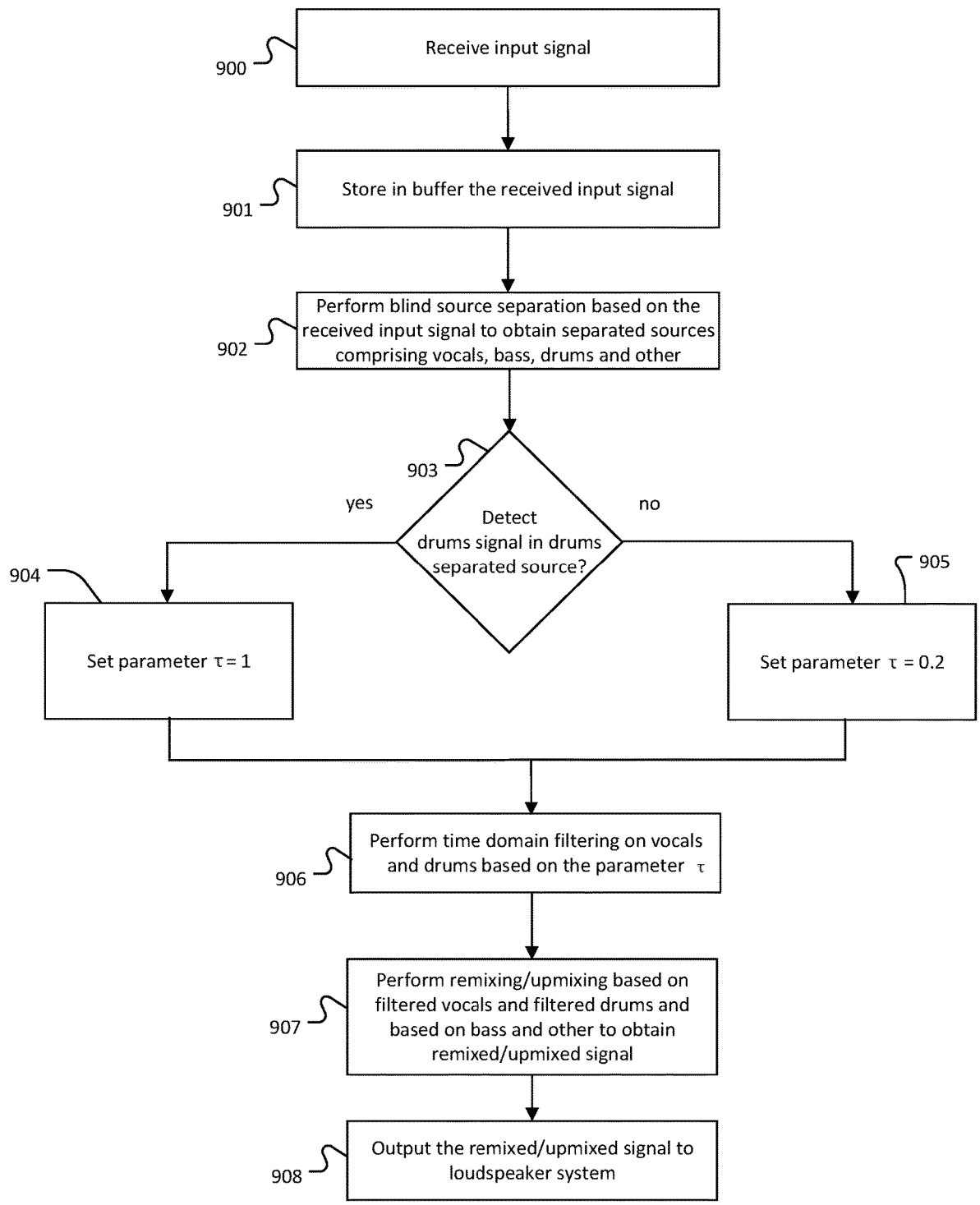
FIG. 9a shows a flow diagram visualizing a method of time-domain filtering based on parameter τ when "drums" signal is detected in "drums" separated sources.

FIG. 9a shows a flow diagram visualizing a method of time-domain filtering in which the parameter τ is made adaptive to the detection of a drums signal in the "drums" separation. In this embodiment, if a "drums" signal is detected in the "drums" separation, then the threshold factor r for the "vocals" separated source may be increased in order to avoid crosstalk from the "drums" to the "vocals". At 900, an input signal is received. At 901, the received input signal is stored in a buffer. At 902, blind source separation is performed on the received input signal to obtain separated sources comprising "vocals", "bass", "drums" and "other". At 903, it is detected if there is a drums signal in the "drums" separation. If a drums signal is detected in the "drums" separation, the method proceeds at 904. If a drums signal is not detected in the "drums" separation, the method proceeds at 905. At 904, the parameter τ is set to 1 and the method proceeds at 906. At 905 the parameter τ is set to 0.2 and the method proceeds at 906. At 906, time-domain filtering is performed on the "vocals" and "drums", based on the parameter τ determined at 904 or at 905, to obtain filtered "vocals" and filtered "drums". At 907, remixing/upmixing is performed based on the filtered "vocals" and filtered "drums" obtained at 906, and based on the "bass" and "other" obtained at 902, to obtain remixed/upmixed signal (see FIG. 2). At 908, the remixed/upmixed signal is output to a loudspeaker system 204 (see FIG. 2).

Figure 9B:
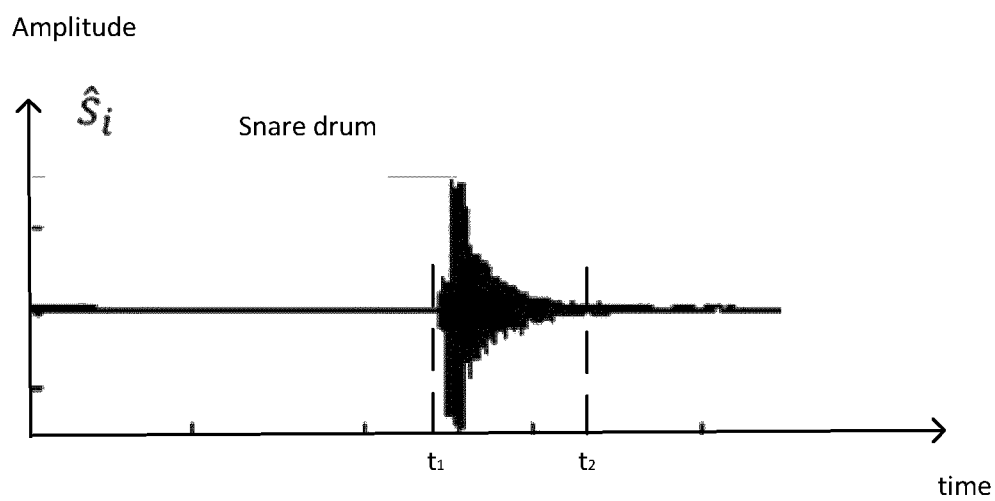
FIG. 9b schematically shows an example of a "drums" audio signal.

With regard to FIG. 9b it is described in more detail how at 903, it is detected if there is a drums signal in the "drums" separation. FIG. 9b schematically shows an example of a "drums" audio signal, here a signal of a snare drum. The snare drum results in a strong signal peak in the drums signal and a reverberation tail. In 903, it is detected if a snare drum event is currently detected in the "drums" separation. In this embodiment, the y-axis represents the amplitude of a signal, here a snare drum and the x-axis represents the time. In particular, the time $t_1$ denotes the time that a sound "attack" is detected in the "drums" separation, wherein a sound "attack" is a strong signal peak e.g. a signal with a high amplitude. The time $t_2$ denotes the time that a release in the "drums" separation is detected, wherein the release is detected when the amplitude of the signal is below a predefined threshold. The amplitude of the signal may for example be related to the short-time energy of the signal.

This short-time energy of the "drums" signal x(n) is given by the equation $$P = \frac{1}{2K+1} \sum_{k=-K}^{K} x(n+k)^2 \qquad (\text{Eq. 2})$$

where x(n) is the signal and A is an index in the time window [−K, K] in which the short-time energy is calculated.

Figure 10:
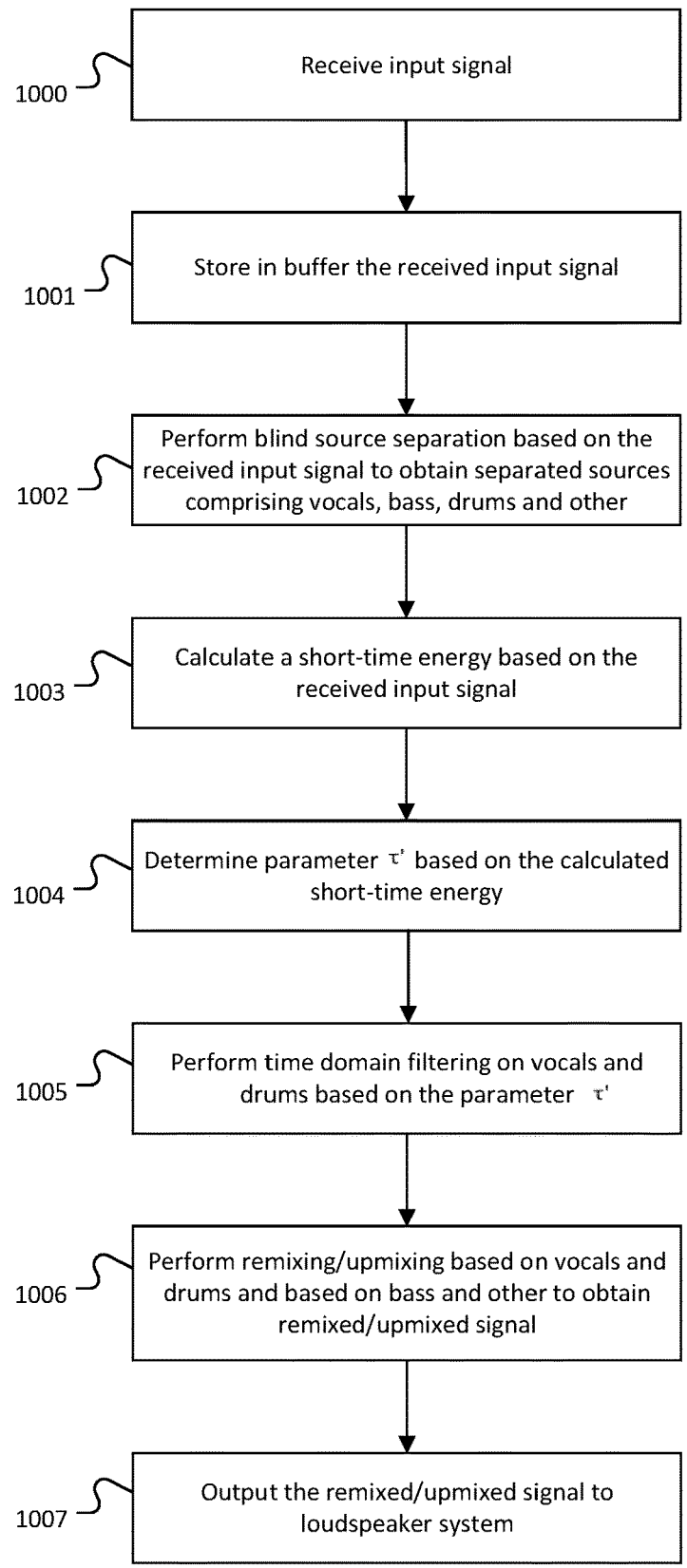
FIG. 10 shows a flow diagram visualizing a method of time-domain filtering based on parameter τ' calculated based on a short-time energy related to the received input signal.

FIG. 10 shows a flow diagram visualizing a method of time-domain filtering based on parameter τ' calculated based on a short-time energy related to the received input signal. At 1000, an input signal is received. At 1001, the received input signal stored in a buffer. At 1002, blind source separation is performed based on the received input signal to obtain separated sources comprising "vocals", "bass", "drums" and "other". At 1003, a short-time energy (see Eq. 2 above) is calculated based on the received input signal. At 1004, parameter τ' is determined, based on the calculated short-time energy. At 1005, time-domain filtering is performed on the "vocals" and "drums", based on the parameter τ' determined at 1004, to obtain filtered "vocals" and filtered "drums". At 1006, remixing/upmixing is performed based on the filtered "vocals" and filtered "drums" obtained at 1005, and based on the "bass" and "other" obtained at 1002, to obtain remixed/upmixed signal (see FIG. 2). At 1007, the remixed/upmixed signal is output to the loudspeaker system 204 (see FIG. 2).

That is, the "gate" may be "open" when the threshold exceeds the threshold $\Sigma \cdot \max_{m,i} |\hat{s}_i(m)|$ (see 403 in FIG. 4), and the new threshold τ', which reflects the short-time energy, will be given by the equation $$\tau = \Sigma_{i=1}^{I} \Sigma_{m'=m-m_0}^{m'=m+m_0} \hat{s}_i(m')^2 \qquad (\text{Eq. 4})$$

where τ denotes the threshold factor and i denotes the channel index.

That is, the "gate" may dynamically change.

Implementation

Figure 11:
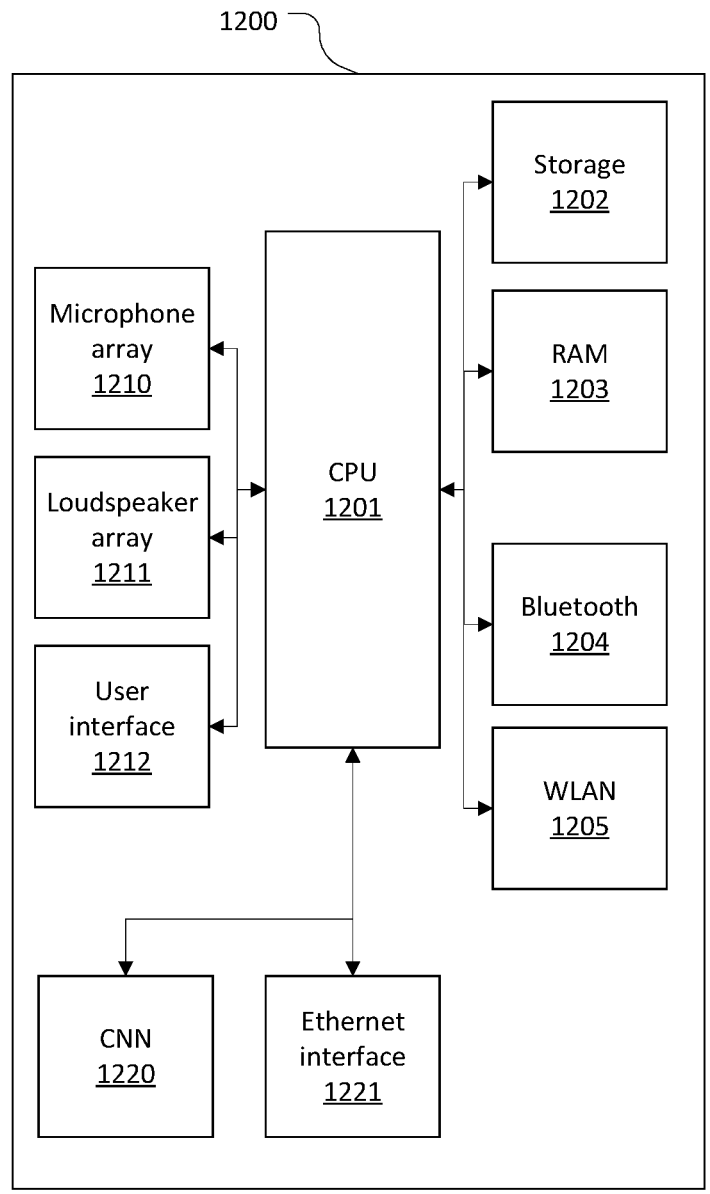
FIG. 11 schematically describes an embodiment of an electronic device that can act as remixing/upmixing system.

FIG. 11 schematically describes an embodiment of an electronic device that can implement the processes of remixing/upmixing based on time-domain filtering, as described above. The electronic device 1200 comprises a CPU 1201 as processor. The electronic device 1200 further comprises a microphone array 1210, a loudspeaker array 1211 and a convolutional neural network unit 1220 that are connected to the processor 1201. Processor 1201 may for example implement a blind source separation 201, an remixing/upmixing 203, a time-domain filtering 202 and/or a bandlimited filtering 205 that realize the processes described with regard to FIG. 2 and FIG. 7 in more detail. The CNN unit may for example be an artificial neural network in hardware, e.g. a neural network on GPUs or any other hardware specialized for the purpose of implementing an artificial neural network. Loudspeaker array 1211 consists of one or more loudspeakers (see 204 in FIG. 2 and FIG. 7) that are distributed over a predefined space and is configured to render 3D audio as described in the embodiments above. The electronic device 1200 further comprises a user interface 1212 that is connected to the processor 1201. This user interface 1212 acts as a man-machine interface and enables a dialogue between an administrator and the electronic system. For example, an administrator may make configurations to the system using this user interface 1212. The electronic device 1200 further comprises an Ethernet interface 1221, a Bluetooth interface 1204, and a WLAN interface 1205. These units 1204, 1205 act as I/O interfaces for data communication with external devices. For example, additional loudspeakers, microphones, and video cameras with Ethernet, WLAN or Bluetooth connection may be coupled to the processor 1201 via these interfaces 1221, 1204, and 1205.

The electronic system 1200 further comprises a data storage 1202 and a data memory 1203 (here a RAM). The data memory 1203 is arranged to temporarily store or cache data or computer instructions for processing by the processor 1201. The data storage 1202 is arranged as a long term storage, e.g., for recording sensor data obtained from the microphone array 1210 and provided to or retrieved from the CNN unit 1220. The data storage 1202 may also store audio data that represents audio messages, which the public announcement system may transport to people moving in the predefined space.

It should be noted that the description above is only an example configuration. Alternative configurations may be implemented with additional or other sensors, storage devices, interfaces, or the like.

It should be recognized that the embodiments describe methods with an exemplary ordering of method steps. The specific ordering of method steps is, however, given for illustrative purposes only and should not be construed as binding.

It should also be noted that the division of the electronic system of FIG. 11 into units is only made for illustration purposes and that the present disclosure is not limited to any specific division of functions in specific units. For instance, at least parts of the circuitry could be implemented by a respectively programmed processor, field programmable gate array (FPGA), dedicated circuits, and the like.

All units and entities described in this specification and claimed in the appended claims can, if not stated otherwise, be implemented as integrated circuit logic, for example, on a chip, and functionality provided by such units and entities can, if not stated otherwise, be implemented by software.

In so far as the embodiments of the disclosure described above are implemented, at least in part, using software-controlled data processing apparatus, it will be appreciated that a computer program providing such software control and a transmission, storage or other medium by which such a computer program is provided are envisaged as aspects of the present disclosure.

Note that the present technology can also be configured as described below:

(1) An electronic device comprising a circuitry configured to perform (402; 602; 902; 1002) blind source separation (201) based on a received input signal (1) to obtain separated sources;
  perform (403; 605; 906; 1005) time-domain filtering (202) on at least one of the separated sources to obtain at least one filtered separated source; and
  perform (404; 606; 907; 1006) remixing or upmixing (203) based on the at least one filtered separated source.

(2) The electronic device of (1), wherein the circuitry is configured to perform the time-domain filtering by processing a window (w, s) around a current sample ($\hat{s}_i(n)$) and setting the current sample ($\hat{s}_i(n)$) to zero if there is no sample in the window (w, s) which has an amplitude that is larger or equal to a threshold value.

(3) The electronic device of (1) or (2), wherein the circuitry is configured to determine the threshold value based on a threshold factor ($\tau$) and based on a maximal signal ($\max_{m,i}|\hat{s}_i(m)|$).

(4) The electronic device of anyone of (1) to (3), wherein the circuitry is configured to perform (404; 606; 907; 1006) the remixing or upmixing (203) based on the at least one filtered separated source and based on the separated sources obtained by the blind source separation (201) to obtain the remixed or upmixed signal.

(5) The electronic device of anyone of (1) to (4), wherein the circuitry is configured to perform the time-domain filtering (202) based on a window size (w).

(6) The electronic device of (2), wherein the circuitry is configured to perform the time-domain filtering (202) based on a windows shift (s).

(7) The electronic device of anyone of (1) to (6), wherein the blind source separation (201) result comprises a vocals separation or a drums separation, and wherein the circuitry is configured to perform the time-domain filtering (202) on the vocals separation, respectively the drums separation, to obtain filtered vocals or filtered drums.

(8) The electronic device of anyone of (1) to (7), wherein the circuitry is further configured to output (405; 607; 908; 1007) the remixed or upmixed signal to a loudspeaker system (204).

(9) The electronic device of anyone of (1) to (8), wherein the circuitry is further configured to perform a bandlimited filtering (205) on the separated sources, and to obtain a bandlimited separated source.

(10) The electronic device of anyone of (1) to (9), wherein the circuitry is configured to perform an adaptive time-domain filtering (202).

(11) The electronic device of (10), wherein the circuitry is configured to perform an adaptive time-domain filtering (202) based on a reverberation time.

(12) The electronic device of (11), wherein the circuitry is configured to determine a windows size and/or a windows shift based on the reverberation time.

(13) The electronic device of (10), wherein the circuitry is configured to perform an adaptive time-domain filtering (202) of a first separated source based on a detected signal in a second separated source.

(14) The electronic device of (13), wherein the second signal is a drums signal in the drums separated source.

(15) The electronic device of anyone of (1) to (14), wherein the circuitry is further configured to calculate (1003) a short-time energy based on the received input signal (1) and configured to determine (1004) a threshold factor ($\tau'$) for the time-domain filtering (202) based on the calculated short-time energy.

(16) The electronic device of anyone of (1) to (15), wherein remixing or upmixing (203) of one or more separated sources of the separated sources includes remixing or upmixing of one selected 25 source of the separated sources or of a selected subgroup of the separated sources.

(17) The electronic device of (16), wherein remixing or upmixing (203) of one or more separated sources of the separated sources includes isolating a specific separated source from the separated sources.

(18) The electronic device of (16), wherein remixing or upmixing (203) of one or more separated sources of the separated sources includes removing a specific separated source from the separated sources.

(19) A method comprising:
  performing (402; 602; 902 1002) blind source separation (201) based on a received input signal (1) to obtain separated sources;
  performing (403; 605; 906; 1005) time-domain filtering (202) on at least one of the separated sources to obtain at least one filtered separated source; and
  performing (404; 606; 907; 1006) remixing or upmixing (203) based on the at least one filtered separated source.

(20) A computer program comprising instructions, the instructions when executed on a processor causing the processor to:
  perform (402; 602; 902 1002) blind source separation (201) based on a received input signal (1) to obtain separated sources;
  perform (403; 605; 906; 1005) time-domain filtering (202) on at least one of the separated sources to obtain at least one filtered separated source; and
  perform (404; 606; 907; 1006) rewiring or upmixing (203) based on the at least one filtered separated source.

The invention claimed is:

1. An electronic device comprising a circuitry configured to:
  perform blind source separation based on a received input signal to obtain separated sources;

perform time-domain filtering on at least one of the separated sources to obtain at least one filtered separated source; and perform remixing or upmixing based on the at least one filtered separated source, wherein the circuitry is configured to perform the time-domain filtering by processing a window around a current sample and setting the current sample to zero if there is no sample in the window which has an amplitude that is larger or equal to a threshold value.

2. The electronic device of claim 1, wherein the circuitry is configured to determine the threshold value based on a threshold factor and based on a maximal signal.

3. The electronic device of claim 1, wherein the circuitry is configured to perform the remixing or upmixing based on the at least one filtered separated source and based on the separated sources obtained by the blind source separation to obtain the remixed or upmixed signal.

4. The electronic device of claim 1, wherein the circuitry is configured to perform the time-domain filtering based on a window size.

5. The electronic device of claim 1, wherein the circuitry is configured to perform the time-domain filtering based on a windows shift.

6. The electronic device of claim 1, wherein the blind source separation result comprises a vocals separation or a drums separation, and wherein the circuitry is configured to perform the time-domain filtering on the vocals separation, respectively the drums separation, to obtain filtered vocals or filtered drums.

7. The electronic device of claim 1, wherein the circuitry is further configured to output the remixed or upmixed signal to a loudspeaker system.

8. The electronic device of claim 1, wherein the circuitry is further configured to perform a bandlimited filtering on the separated sources, and to obtain a bandlimited separated source.

9. The electronic device of claim 1, wherein the circuitry is configured to perform an adaptive time-domain filtering.

10. The electronic device of claim 9, wherein the circuitry is configured to perform an adaptive time-domain filtering based on a reverberation time.

11. The electronic device of claim 10, wherein the circuitry is configured to determine a windows size and/or a windows shift based on the reverberation time.

12. The electronic device of claim 9, wherein the circuitry is configured to perform an adaptive time-domain filtering of a first separated source based on a detected signal in a second separated source.

13. The electronic device of claim 12, wherein the second separated source is a drums signal in the drums separated source.

14. The electronic device of claim 1, wherein the circuitry is further configured to calculate a short-time energy based on the received input signal and configured to determine a threshold factor for the time-domain filtering based on the calculated short-time energy.

15. The electronic device of claim 1, wherein remixing or upmixing of one or more separated sources of the separated sources includes remixing or upmixing of one selected source of the separated sources or of a selected subgroup of the separated sources.

16. The electronic device of claim 15, wherein remixing or upmixing of one or more separated sources of the separated sources includes isolating a specific separated source from the separated sources.

17. The electronic device of claim 15, wherein remixing or upmixing of one or more separated sources of the separated sources includes removing a specific separated source from the separated sources.

18. A method comprising:
performing blind source separation based on a received input signal to obtain separated sources;
performing time-domain filtering on at least one of the separated sources to obtain at least
one filtered separated source; and
performing remixing or upmixing based on the at least one filtered separated source,
wherein the time-domain filtering is performed by processing a window around a current sample and setting the current sample to zero if there is no sample in the window which has an amplitude that is larger or equal to a threshold value.

19. A non-transitory computer-readable medium storing a computer program comprising instructions that, when executed by a processor, cause the processor to perform a method comprising:
performing blind source separation based on a received input signal to obtain separated sources;
performing time-domain filtering on at least one of the separated sources to obtain at least one filtered separated source; and
performing remixing or upmixing based on the at least one filtered separated source,
wherein the time-domain filtering is performed by processing a window around a current sample and setting the current sample to zero if there is no sample in the window which has an amplitude that is larger or equal to a threshold value.

* * * * *